United States Patent
Cho et al.

(10) Patent No.: US 10,879,412 B2
(45) Date of Patent: Dec. 29, 2020

(54) SOLAR CELL PANEL

(71) Applicant: LG Electronics Inc., Seoul (KR)

(72) Inventors: Haejong Cho, Seoul (KR); Jaewon Chang, Seoul (KR); Jinsung Kim, Seoul (KR); Chunghyun Lim, Seoul (KR)

(73) Assignee: LG Electronics Inc., Seoul (KR)

( * ) Notice: Subject to any disclaimer, the term of this patent is extended or adjusted under 35 U.S.C. 154(b) by 10 days.

(21) Appl. No.: 15/968,319

(22) Filed: May 1, 2018

(65) Prior Publication Data

US 2019/0181287 A1    Jun. 13, 2019

(30) Foreign Application Priority Data

Dec. 7, 2017  (KR) .......................... 10-2017-0167413

(51) Int. Cl.
| | |
|---|---|
| *H01L 31/05* | (2014.01) |
| *H01L 31/0224* | (2006.01) |
| *H01L 31/02* | (2006.01) |
| *H01L 31/042* | (2014.01) |

(52) U.S. Cl.
CPC ...... *H01L 31/0512* (2013.01); *H01L 31/0201* (2013.01); *H01L 31/02008* (2013.01); *H01L 31/022425* (2013.01); *H01L 31/042* (2013.01); *H01L 31/0504* (2013.01)

(58) Field of Classification Search
CPC ........... H01L 31/0512; H01L 31/02008; H01L 31/0201; H01L 31/022425; H01L 31/042; H01L 31/0504
See application file for complete search history.

(56) References Cited

U.S. PATENT DOCUMENTS

| | | |
|---|---|---|
| 7,754,973 B2 | 7/2010 | Shiomi et al. |
| 9,147,788 B2 | 9/2015 | Degroot et al. |
| 2007/0283997 A1* | 12/2007 | Hachtmann ....... H01L 31/03928 136/244 |

(Continued)

FOREIGN PATENT DOCUMENTS

KR        100785730 B1    12/2007

OTHER PUBLICATIONS

International Search Report in International Application No. PCT/KR2018/003818, dated Aug. 27, 2018, 4 pages (English Translation).

*Primary Examiner* — Jayne L Mershon
(74) *Attorney, Agent, or Firm* — Fish & Richardson P.C.

(57) ABSTRACT

A solar cell panel includes a solar cell string including a plurality of solar cells connected to each other and arranged in a first direction, a connection member that connects two adjacent solar cells of the plurality of solar cells to each other in the first direction and that is located an overlapped portion between the two adjacent solar cells, the connection member including a first conductive material, a first interconnector connected to an end solar cell positioned at an end of the solar cell string, a second interconnector connected to the first interconnector, a first connection structure that connects the end solar cell to the first interconnector and that includes the first conductive material, and a second connection structure that connects the first interconnector to the second interconnector and that includes a second conductive material that is different from the first conductive material.

20 Claims, 8 Drawing Sheets

(56) References Cited

U.S. PATENT DOCUMENTS

| | | | |
|---|---|---|---|
| 2008/0083453 A1* | 4/2008 | Rose | H01L 31/0201 |
| | | | 136/256 |
| 2012/0204933 A1* | 8/2012 | Iwade | B32B 37/226 |
| | | | 136/244 |
| 2013/0206213 A1 | 8/2013 | He et al. | |
| 2015/0020877 A1* | 1/2015 | Moslehi | H01L 31/022441 |
| | | | 136/256 |
| 2015/0349701 A1 | 12/2015 | Morad et al. | |
| 2018/0108796 A1* | 4/2018 | Heng | H01L 31/043 |
| 2019/0081198 A1* | 3/2019 | Morad | H01L 31/042 |

* cited by examiner

SOLAR CELL PANEL

CROSS-REFERENCE TO RELATED APPLICATION

This application claims priority to and the benefit of Korean Patent Application No. 10-2017-0167413, filed in the Korean Intellectual Property Office on Dec. 7, 2017, the entire contents of which are incorporated herein by reference.

FIELD

This disclosure relates to a solar cell panel, and, more particularly, to a solar cell panel having an improved structure.

BACKGROUND

Recently, as energy resources such as oil and coal are expected to be depleted, interest in alternative energy to replace them is increasing. Among them, solar cells are attracting attention as a next generation battery which converts solar energy into electric energy. In solar cells, various layers and electrodes are manufactured by design.

Efficiency, stability, and productivity of a solar cell or a solar cell panel may be changed according to a design of various layers and electrodes of solar cells, a connection structure of solar cells, and the like. Accordingly, it is required to connect the solar cells with a structure being able to improve efficiency, stability, and productivity of a solar cell and a solar cell panel.

SUMMARY

Therefore, embodiments of the invention have been made in view of the above problems, and the embodiments of the invention are to provide a solar cell panel having enhanced efficiency, stability, and productivity.

A solar cell panel according to an embodiment includes: a plurality of solar cells, each having a major axis and a minor axis, wherein two adjacent solar cells of the plurality of solar cells being connected in a first direction by a connection member positioned between overlapped portions of the two adjacent solar cells to form a solar cell string; a first interconnector connected to an end solar cell of the plurality of solar cells that is positioned at an end of the solar cell string; and a second interconnector connected to the first interconnector. A first connection structure for connecting the end solar cell and the first interconnector is different from a second connection structure for connecting the first interconnector and the second interconnector, a first conductive material of the first connection structure is different from a second conductive material of the second connection structure, and a conductive material of the connection member is the same as the first conductive material.

According to an embodiment, a first connection structure for connecting a solar cell and a first interconnector is different from a second connection structure for connecting a first interconnector and a second interconnector, and thus, an adhesion force, an electrical connection property, and the like between the solar cell and the first and second interconnectors can be improved, and a cost of the first and second interconnectors can be reduced. Thus, stability, efficiency, and productivity of the solar cell panel can be improved.

DETAILED DESCRIPTION

Figure 1:
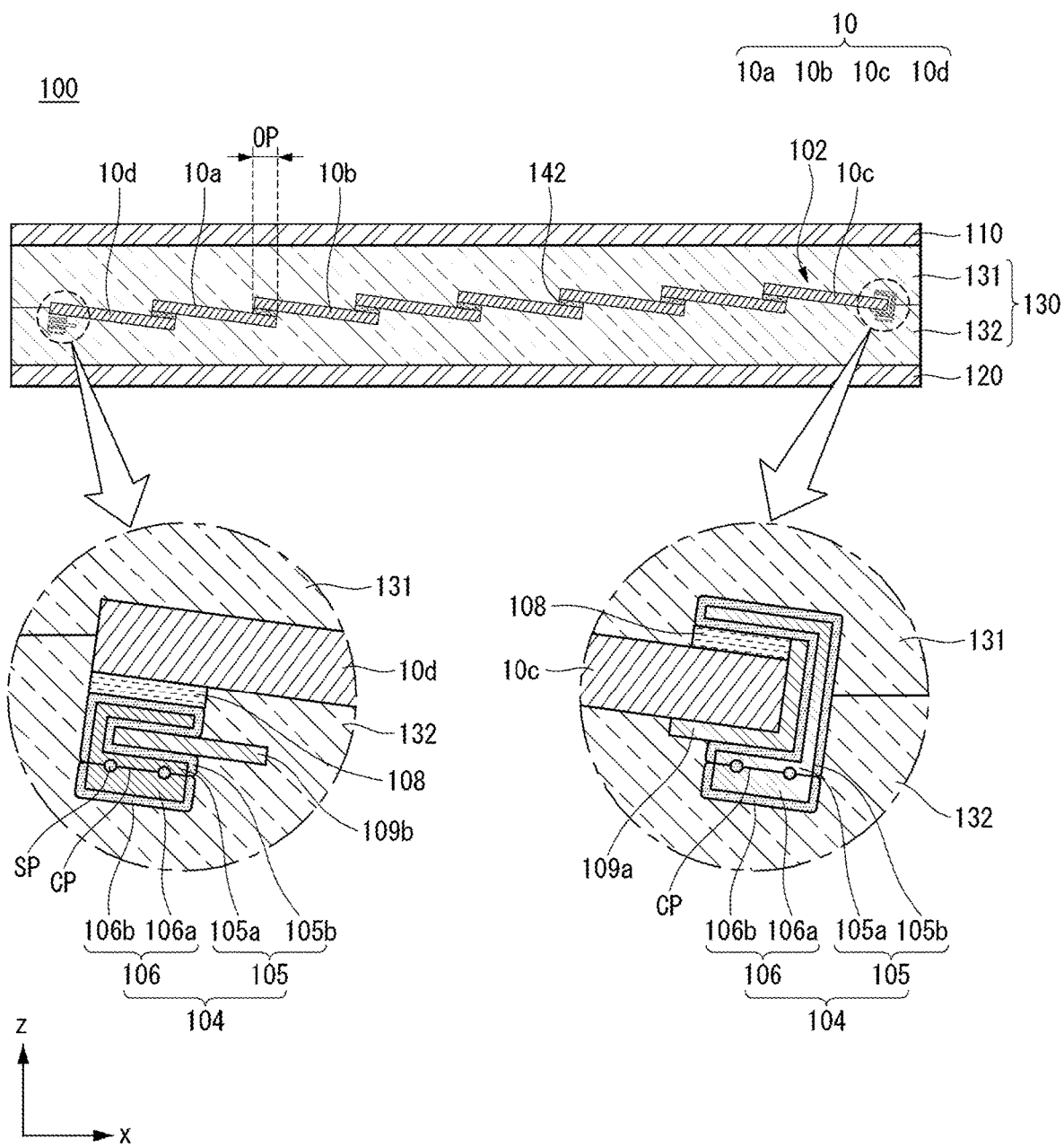
FIG. 1 is a schematic cross-sectional view showing a solar cell panel according to an embodiment of the invention.

Hereinafter, embodiments of the invention will be described in detail with reference to accompanying drawings. However, embodiments of the invention are not limited thereto, and may be modified to other various embodiments.

In the drawings, illustration of portions unrelated to descriptions is omitted for clarity and simplicity. The same reference numerals designate the same or very similar elements throughout the specification. In the drawings, thicknesses, widths or the like of elements are exaggerated or reduced for clarity of descriptions, and thus, embodiments of the invention are not limited to the thickness, widths, or the like.

It will be understood that terms "comprise" and/or "comprising," or "include" and/or "including" used in the specification do not preclude a presence or addition of one or more other elements. In addition, it will be understood that, when an element such as a layer, film, region, or plate is referred to as being "on" another element, it may be disposed "directly on" another element or may be disposed such that an intervening element is also present therebetween. Accordingly, when an element such as a layer, film, region, or plate is disposed "directly on" another element, this means that there is no intervening element between the elements.

Hereinafter, a solar cell panel according to an embodiment of the invention will be described in detail with reference to the accompanying drawings.

FIG. 1 is a schematic cross-sectional view showing a solar cell panel 100 according to an embodiment of the invention. For reference, FIG. 1 is a cross-sectional view showing a solar cell string 102 positioned at a left side among a plurality of solar cell strings 102 shown in FIG. 2.

Referring to FIG. 1, a solar cell panel 100 according to the embodiment includes a solar cell 10 and an interconnector member 104 connecting the solar cell 10 connected to an outside (for example, an external circuit) or another solar cell 10. A plurality of solar cells 10 may be connected to each other in a first direction (an x-axis direction in the drawings) to form a solar cell string 102, and the interconnector member 104 may include a portion crossing the first direction at an end portion of the solar cell string 102 to connect the solar cell string 102 to an outside or another solar cell string 102. The solar cell panel 100 may include a sealing material 130 that surrounds and seals the solar cell string 102 and the interconnector member 104, a first cover member 110 that is positioned on a surface of the solar cell 10 on the sealing material 130, and a second cover member 120 that is positioned on the other surface of the solar cell 10 on the sealing member 130. This will be described in more detail.

The solar cell 10, the solar cell string 102, and the interconnector member 104 will be described in detail later with reference to FIGS. 2 to 5.

The first cover member 110 is disposed on the sealing material 130 (for example, the first sealing member 131) to constitute a surface (for example, a front surface) of the solar cell panel 100, and the cover member 120 is disposed on the sealing member 130 (for example, the second sealing member 132) to constitute the other surface (for example, a back surface) of the solar cell panel 100. Each of the first cover member 110 and the second cover member 120 may be formed of an insulating material capable of protecting the solar cell 10 from external shock, moisture, ultraviolet rays, or the like. The first cover member 110 may be formed of a light-transmitting material that can transmit light, and the second cover member 120 may be formed of a sheet of a light-transmitting material, a non-light-transmitting material, or a reflective material. For example, the first cover member 110 may be formed of a glass substrate having excellent durability and an excellent insulation property, and the second cover member 120 may be formed of a film or a sheet. The second cover member 120 may have a TPT (Tedlar/PET/Tedlar) type or may include a base film (for example, a polyvinylidene fluoride (PET) film) and a polyethylene-erephthalate(VDF) resin layer formed on at least one surface of the base film.

The sealing member 130 may include the first sealing member 131 positioned on the front surface of the solar cell 10 or the solar cell string 102 and the second sealing member 131 positioned on the back surface of the solar cell 10 or the solar cell string 102. The first sealing member 131 and the second sealing member 132 prevent moisture and oxygen from entering and chemically couple members of the solar cell panel 100. The first and second sealing materials 131 and 132 may be formed of an insulating material having a light-transmitting property and an adhesive property. For example, an ethylene-vinyl acetate copolymer resin (EVA), a polyvinyl butyral, a silicone resin, an ester-based resin, an olefin-based resin, or the like may be used for the first sealing member 131 or the second sealing member 132. The second cover member 120, the second seal member 132, the solar cell string 102, the interconnector member 104, the first seal member 132, and the second seal member 132 are integrated by a lamination process using the first and second seal members 131 and 132 to form the solar cell panel 100.

However, embodiments of the invention are not limited thereto. Accordingly, the first and second sealing members 131 and 132, the first cover member 110, or the second cover member 120 may include any of various materials other than those described above, and may have any of various shapes. For example, the first cover member 110 or the second cover member 120 may have any of various forms (e.g., a substrate, film, sheet, etc.) or material.

The solar cell 10 and the solar cell string 102 included in the solar cell panel 100 according to the embodiment will be described in detail with reference to FIG. 1, and FIG. 2 to FIG. 4.

Figure 2:
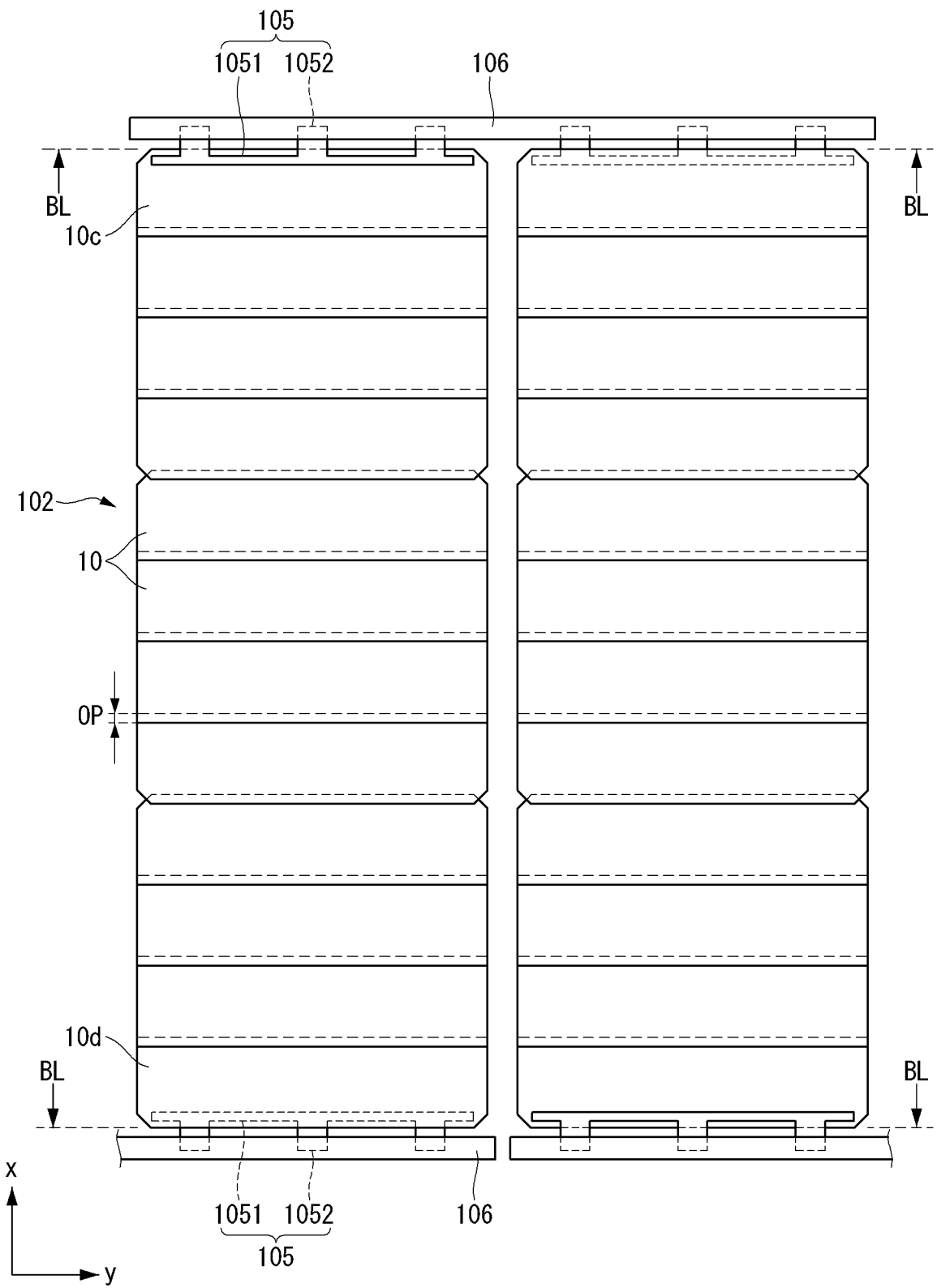
FIG. 2 is a developed view schematically showing some of a plurality of solar cell strings and interconnector members connected thereto, which are included in the solar cell panel shown in FIG. 1.
Figure 3:
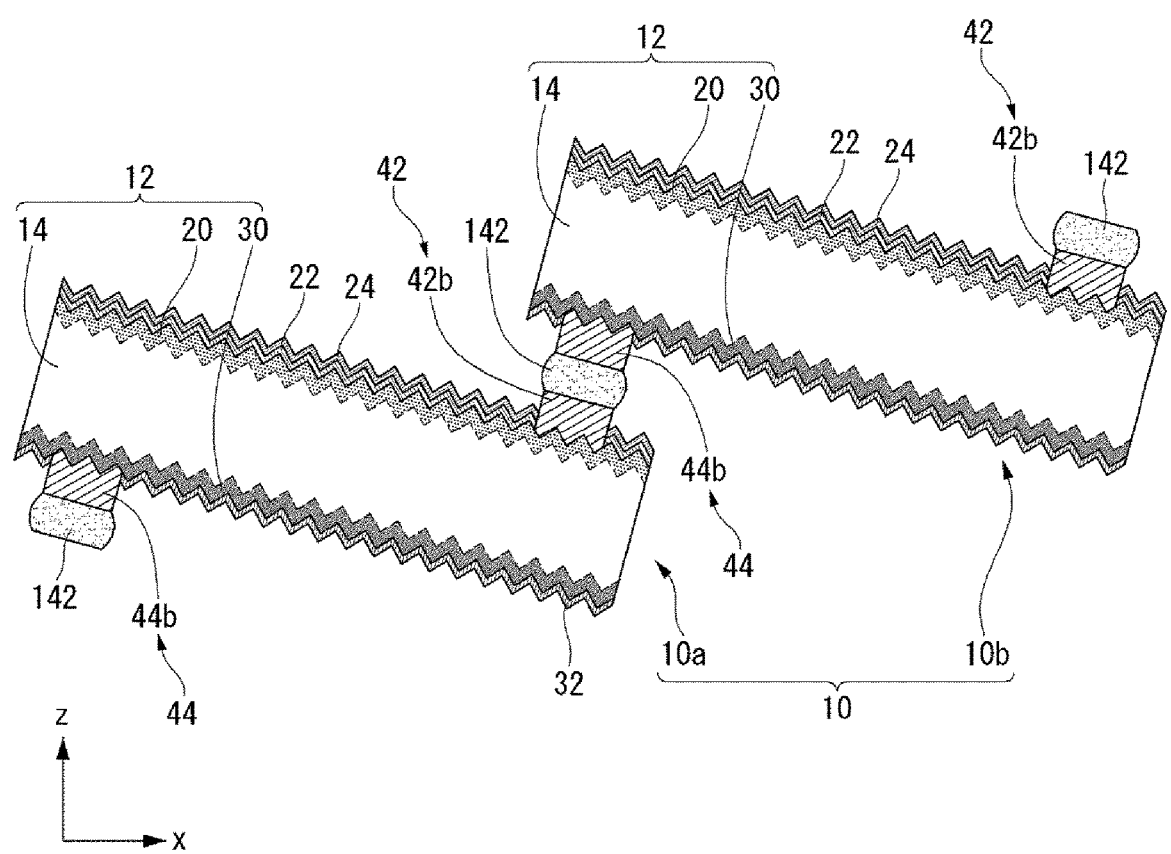
FIG. 3 is a cross-sectional view schematically showing two solar cells included in the solar cell string shown in FIG. 1 and connected to each other by a connection member.
Figure 4:
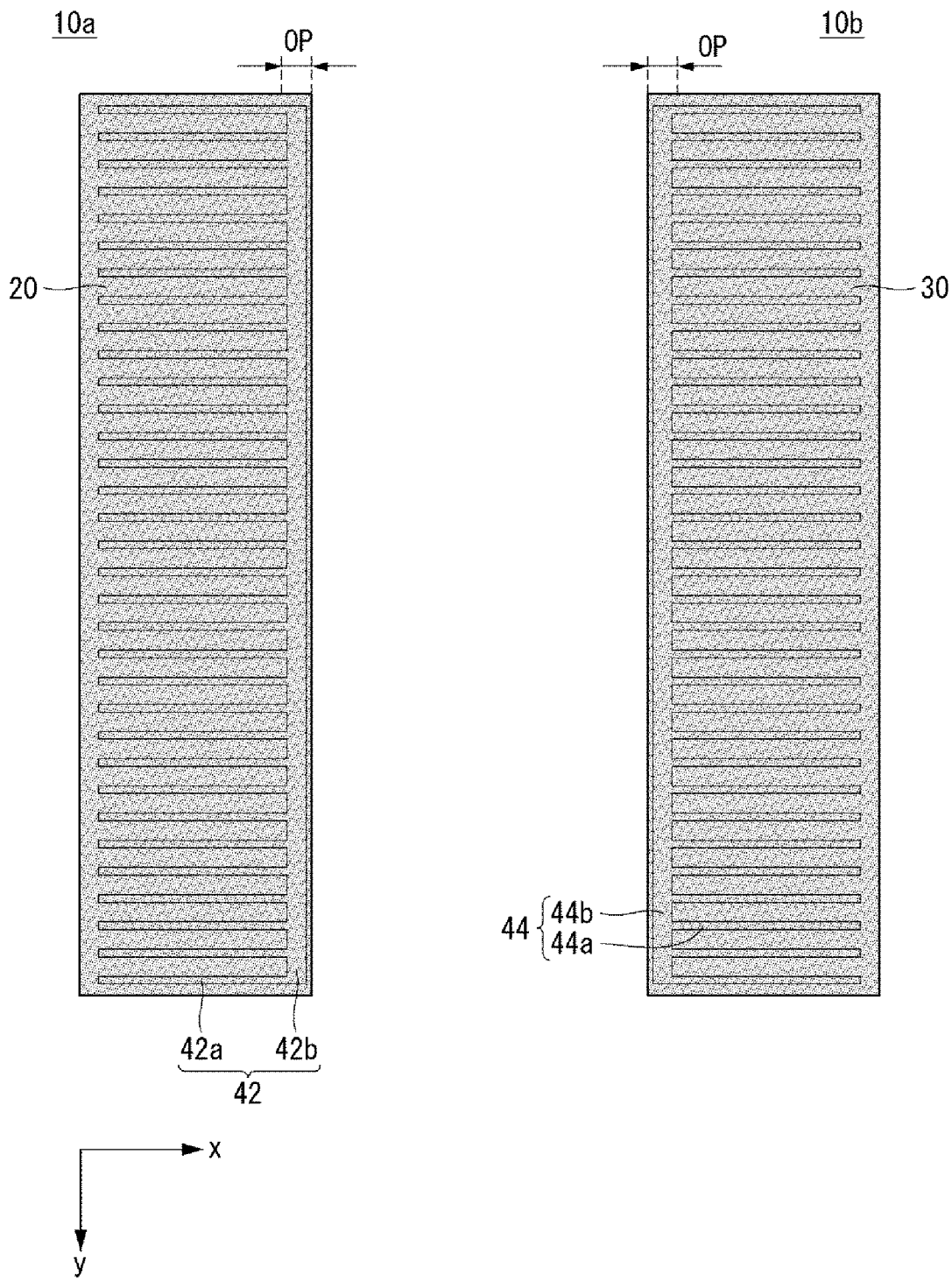
FIG. 4 is a front view and a rear plan view showing an example of a solar cell included in the solar cell panel shown in FIG. 1.

FIG. 2 is a developed view (an unfolded view) schematically showing some of a plurality of solar cell strings 102 and the interconnector members 104 connected thereto, which are included in the solar cell panel 100 shown in FIG. 1. FIG. 3 is a cross-sectional view schematically showing two solar cells 10 (for example, a first solar cell 10a and a second solar cell 10b) included in the solar cell string 102 shown in FIG. 1 and connected to each other by a connection member 142. FIG. 4 is a front view and a rear plan view showing an example of the solar cell 10 included in the solar cell panel 100 shown in FIG. 1. A first electrode 42, a second electrode 44, the connection member 142, and an electrical conductive adhesive layer 108 are not shown in FIG. 2 for clarity and simplicity. A front plan view showing a front surface of the first solar cell 10a is shown in a left side of FIG. 4, and a rear plan view showing a back surface of the second solar cell 10b on a right side of FIG. 4.

Referring to FIGS. 2 to 4, in the embodiment, the solar cell 10 may be formed by cutting a mother solar cell to have a major axis (a long axis) and a minor axis (a short axis). That is, one mother solar cell is cut to manufacture a plurality of solar cells 10 having a major axis and a minor axis, and the cut solar cell 10 is used as a unit solar cell. When the solar cell panel 100 is manufactured by connecting the plurality of solar cells 10 that are formed by cutting, output loss of the solar cell panel 100 (that is, cell to module loss (CTM loss)) can be reduced.

The output loss cell of each solar cell 10 has a value obtained by multiplying a square of a current by an electric resistance, and the output loss of the solar cell panel 100 including the plurality of solar cells 10 has a total value obtained by multiplying the value, which is obtained by multiplying the square of the current by the electric resistance, by a number of solar cells 10. However, in the current of each solar cell 10, there is a current generated by an area of the solar cell 10 itself. Thus, the current becomes greater when the area of the solar cell 10 increases, while the current becomes smaller when the area of the solar cell 10 decreases.

Therefore, when the solar cell panel 100 includes the solar cells 10 manufactured by cutting the mother solar cell, the current of each solar cell 10 decreases in proportion to the area, but the number of the solar cell 10 increases inversely. For example, when there are four solar cells 10 manufactured from the mother solar cell, the current in each solar cell 10 is reduced to one quarter of the current of the mother solar cell, and the number of solar cells 10 is four times the number of mother solar cell. The current is reflected as a square and the number is reflected as it is, and thus, the output loss is reduced to a quarter. Accordingly, the output loss of the solar cell panel 100 according to the embodiment can be reduced.

In the embodiment, a mother solar cell is manufactured as in the conventional manner, and then, the solar cell 10 is formed by cutting the mother solar cell. According to this, the solar cell 10 can be manufactured by manufacturing the mother solar cell using a used equipment and optimized design as it is, and then cutting the mother solar cell. As a result, a cost in equipment and process is minimized. On the other hand, if an area of a solar cell or a mother solar cell itself is reduced, it is burdened to replace an equipment or change a setting (for example, process conditions, etc).

More specifically, the mother solar cell or a semiconductor substrate thereof may be manufactured from a roughly circular ingot and may have a circular shape, a square shape, or a shape where lengths in two directions (x-axis and y-axis directions in the drawings) are the same or very similar. For example, the semiconductor substrate of the mother solar cell may have an octagonal shape having inclined portions 12a and 12b at four corner portions at an approximate square shape. With such a shape, the semiconductor substrate having a maximum area can be obtained from the same ingot. For reference, four solar cells 10, which are adjacent to each other in order from the top in FIG. 2, may be manufactured in one mother solar cell. However, embodiments of the invention are not limited thereto, and the number of solar cells 10 manufactured from one mother solar cell may be variously modified.

As described above, the mother solar cell has a symmetrical shape and a maximum lateral width (a width across a center of the semiconductor substrate) and a maximum vertical width (a length across a center of the semiconductor substrate) in the mother solar cell are the same.

The solar cell 10 formed by cutting such a mother solar cell along a cutting line extending in one direction (for example, the y-axis direction in the drawing) may have a major axis and a minor axis. The plurality of solar cells 10 manufactured in the above may be electrically connected to each other by using the connection member 142 positioned at the overlapped portions OP to form the solar cell string 102. The interconnector member 104 may be connected to an end of the solar cell panel 102 (more particularly, a first or second end solar cell 10c or 10d positioned at the end of the solar cell string 102).

A structure of the solar cell 10 will be described with reference to FIGS. 3 and 4, and then, a connection structure of the plurality of solar cells 10 and a connection structure of the solar cell 10 and the interconnector member 104 with reference to FIG. 2 to FIG. 4 will be described in more detail.

Referring to FIG. 3, the solar cell 10 according to the embodiment includes a semiconductor substrate 12, conductive regions 20 and 30 formed at or on the semiconductor substrate 12, and electrodes 42 and 44 connected to the conductive regions 20 and 30, respectively. That is, the solar cell 10 according to the embodiment may be a crystalline solar cell based on the semiconductor substrate 12. For example, the conductive regions 20 and 30 may include a first conductive region 20 and a second conductive region 30 having different conductivity types, and the electrodes 42 and 44 may include a first electrode 42 connected to the conductive region 20 and a second electrode 44 connected to the second conductive region 30.

The semiconductor substrate 12 may include a base region 14 including a first or second conductivity type dopant to have a first or second conductivity type at a relatively low doping concentration. In one example, the base region 14 may have a second conductivity type. The base region 14 may be formed of a single-material crystalline semiconductor (e.g., a single-material single-crystalline or polycrystalline semiconductor, such as, single-crystalline or polycrystalline silicon, more particularly, single-crystalline silicon) including a first or second conductivity type dopant. The solar cell 10 based on the base region 14 or the semiconductor substrate 12 having a high degree of crystallinity and having few defects is excellent in electrical property. In this instance, at least one of the front surface and the back surface of the semiconductor substrate 12 may be provided with a texturing structure or an anti-reflection structure having a concavo-convex shape such as a pyramid to minimize reflection.

The conductive regions 20 and 30 may include the first conductive region 20 having the first conductivity type and positioned on one surface (for example, a front surface) of the semiconductor substrate 12, and the second conductive region 30 having the second conductivity type and positioned on the other surface (e.g., the back surface) of the semiconductor substrate 12. The conductive regions 20 and 30 may have a conductivity type different than that of the base region 14 or may have a higher doping concentration than the base region 14. In the embodiment, the first and second conductive regions 20 and 30 are formed of a doped region constituting a part of the semiconductor substrate 12, and thus, a junction property with the base region 14 can be improved. In this instance, the first conductive region 20 or the second conductive region 30 may have a homogeneous structure, a selective structure, or a local structure.

However, embodiments of the invention are not limited thereto, and at least one of the first and second conductive regions 20 and 30 may be formed separately from the semiconductor substrate 12 on the semiconductor substrate 12. In this instance, the first or second conductive region 20 or 30 may be formed of a semiconductor layer (for example, an amorphous semiconductor layer, a microcrystalline semiconductor layer, or polycrystalline semiconductor layer, for example, an amorphous silicon layer, a microcrystalline silicon layer, or polycrystalline silicon layer) having a crystal structure different from that of the semiconductor substrate 12. Then, the first or second conductive region 20 or 30 can be easily formed on the semiconductor substrate 12.

One region of the first and second conductive regions 20 and 30, which has a conductivity type different from that of the base region 14, constitutes at least a part of an emitter region. The other region of the first and second conductive regions 20 and 30, which has a conductivity type the same as that of the base region 14, constitutes at least a part of a surface field region. For example, in the embodiment, the base region 14 and the second conductive region 30 may have an n-type as the second conductivity type, and the first conductive region 20 may have a p-type. Then, the base region 14 and the first conductive region 20 form a pn junction. When light is incident to the pn junction, electrons generated by a photoelectric effect move toward the back surface of the semiconductor substrate 12 and are collected by the second electrode 44, and holes move toward the front surface of the semiconductor substrate 12 and are collected by the first electrode 42, thereby generating electric energy. Then, holes having a slower moving speed than electrons may move to the front surface of the semiconductor substrate 12, not the back surface thereof, thereby improving efficiency. However, embodiments of the invention are not limited thereto. Thus, the base region 14 and the second conductive region 30 may have a p-type and the first conductive region 20 may have an n-type. The base region 14 may have the conductivity type the same as that of the second conductive region 30 and opposite to that of the first conductive region 20.

In this instance, as the first or second conductivity type dopant, any of various materials which represent n-type or p-type may be used. As the p-type dopant, a group III element such as boron (B), aluminum (Al), gallium (Ga), or indium (In) may be used. As the n-type, a group V element such as phosphorus (P), arsenic (As), bismuth (Bi), or antimony (Sb) may be used. For example, the p-type dopant may be boron (B) and the n-type dopant may be phosphorus (P).

A first passivation layer 22 and/or anti-reflection layer 24, which is a first insulating layer 22, may be formed on (e.g., in contact with) the front surface of the semiconductor substrate 12 (more particularly, the first conductive region 20 formed at the front surface of the semiconductor substrate 12). A second passivation layer 32, which is a second insulating layer, may be formed on (e.g., in contact with) the back surface of the semiconductor substrate 12 (more particularly, the second conductive region 30 formed at the back surface of the semiconductor substrate 12). The first passivation layer 22, the anti-reflection layer 24, and the second passivation layer 32 may be formed of any of various insulating materials. For example, the first passivation layer 22, the anti-reflection layer 24, or the second passivation layer 32 may be formed of a single layer or have a multi-layered structure in which two or more layer are included. The single layer or the multi-layered structure may include at least one of a silicon nitride film, a silicon nitride film including hydrogen, a silicon oxide film, a silicon oxynitride film, an aluminum oxide film, a silicon carbide film, ZnS, TiO2, and CeO2. However, embodiments of the invention are not limited thereto.

The first electrode 42 is electrically connected to the first conductive region 20 through an opening passing through the first insulating layer and the second electrode 44 is electrically connected to the first conductive region 20 through an opening passing through the second insulating layer. The first and second electrodes 42 and 44 are formed of any of various conductive materials (e.g., metal) and may have any of various shapes.

Referring to FIGS. 3 and 4, the first electrode 42 may include a plurality of first finger electrodes 42a spaced apart from each other with a predetermined pitch. In FIG. 4, it is exemplified that the first finger electrodes 42a extend in a direction of the minor axis, are parallel to each other, and are parallel to one edge of the semiconductor substrate 12.

The first electrode 42 may include a first bus bar electrode 42b extending in a direction of the direction of the major axis (the y-axis direction) crossing (for example, perpendicular to) the direction of the minor axis and connecting ends of the first finger electrodes 42a. The first bus bar electrode 42b is positioned in the overlapped portion OP overlapping another solar cell 10 and is a portion where the connection member 142 connecting two adjacent solar cells 10 is directly positioned. In this instance, a width of the first bus bar electrode 42b may be greater than a width of the first finger electrode 42a, but embodiments of the invention are not limited thereto. Therefore, the width of the first bus bar electrode 42b may be equal to or less than the width of the first finger electrode 42a. Also, the first bus bar electrode 42b may be not positioned in the overlapped portion OP.

In a cross-sectional view, both of the first finger electrode 42a and the first bus bar electrode 42b of the first electrode 42 may be formed through the first insulating layer. However, embodiments of the invention are not limited thereto. As another example, the first finger electrode 42a of the first electrode 42 may be formed through the first insulating layer, and the first bus bar electrode 42b may be formed on the first insulating layer.

Similarly, the second electrode 44 may include a plurality of second finger electrodes 44a, and a second bus bar electrode 44b connecting ends of the plurality of second electrodes 44a. The contents of the first electrode 42 may be applied to the second electrode 44 as it is and the content of the first insulating layer with respect to the first electrode 42 may be applied to the second insulating layer with respect to the second electrode 44 as it is, if there is no other description. The width and the pitch of the first finger electrode 42a and the first bus bar electrode 42b of the first electrode 42 may be the same as or different from the width and the pitch of the second finger electrode 44a and the second bus bar 44b of the second electrode 44.

In the embodiment, the first bus bar electrode 42b is provided at one end of the first finger electrode 42a and the second bus bar electrode 44b is provided at the other end of the second finger electrode 44a. More specifically, the first bus bar electrode 42b may extend along the direction of the major axis (the y axis direction in the drawing) of the semiconductor substrate 12 at one side of the semiconductor substrate 12 in the direction of the minor axis, and the second bus bar electrode 44b may extend along the direction of the major axis of the semiconductor substrate 12 at the other side of the semiconductor substrate 12 in the direction of the minor axis.

Then, when the solar cell 10 is connected, the first bus bar electrode 42b positioned at the one side of one solar cell 10 and the second bus bar electrode 44b positioned at the other side of the adjacent solar cell 10 are adjacent to each other at the overlapped portion OP, and thus, the two adjacent solar cells 10 can be stably connected by adhering them with the connection member 142. In addition, the first and second bus bar electrodes 42b and 44b may be formed only at one side, and thus, a material cost of the first and second electrodes 42 and 44 can be reduced and a manufacturing process for forming the first and second electrodes 42 and 44 can be simplified.

Figure 6:
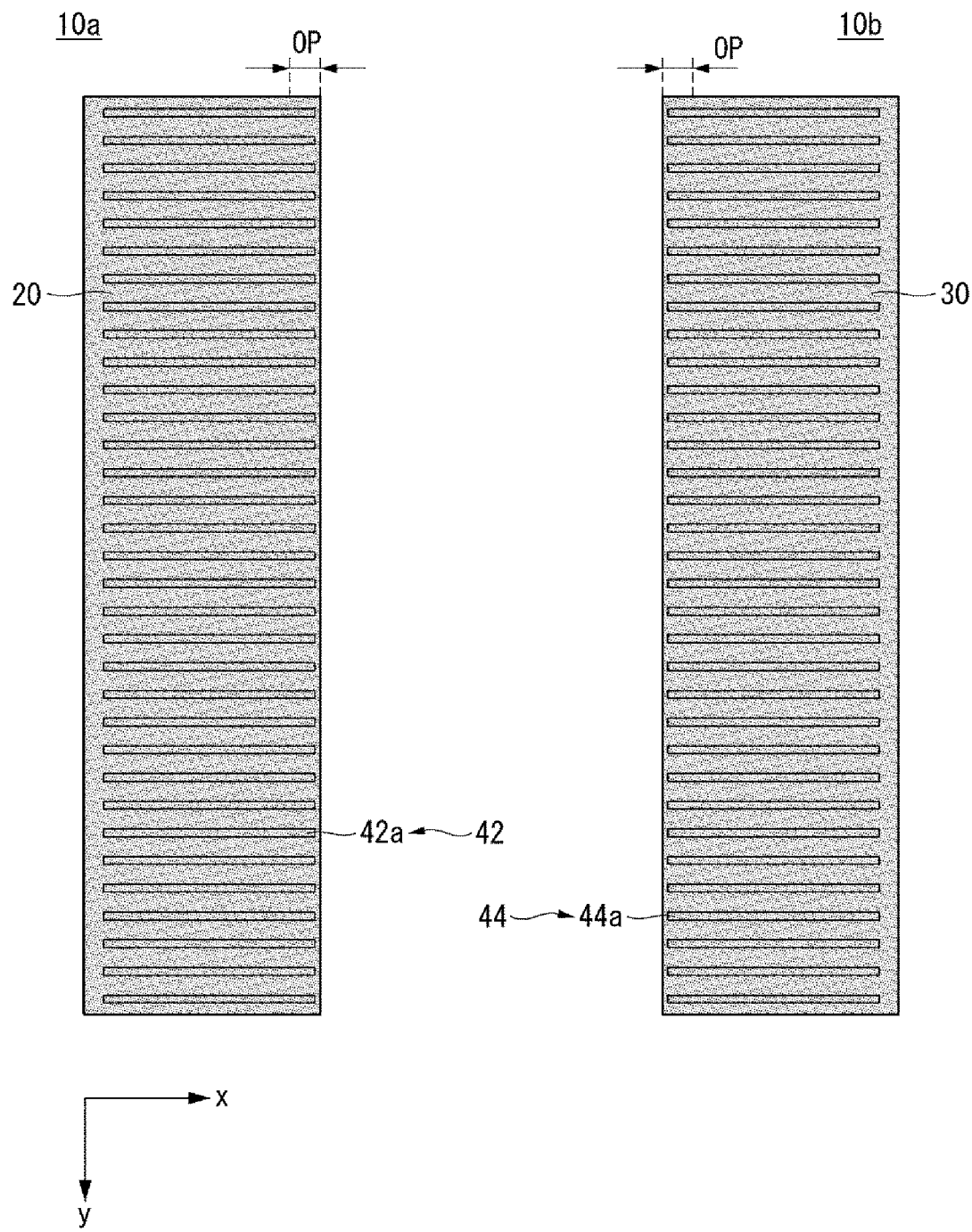
FIG. 6 is a front view and a rear plan view showing an example of a solar cell included in a solar cell panel according to a modified embodiment.

However, embodiments of the invention are not limited thereto. Therefore, as shown in FIG. 6, the first and second bus bar electrodes 42b and 44b may not be included. When the first and second bus bar electrodes 42b and 44b are not included as shown in FIG. 6, the connection member 142 is connected to (e.g., in contact with) the first and second finger electrodes 42a and 44a positioned in the overlapped portions OP. In this instance, at the front surface of the first solar cell 10a, the connection member 142 longitudinally extends on (e.g., is in contact with or is attached to) the first finger electrodes 42a and the first insulating layer (e.g., the passivation layer 22 and the anti-reflection layer 24) between the first finger electrodes 42a. Accordingly, the connection member 142 may be alternately disposed on the first finger electrode 42a and the first insulating layer at the front surface of the first solar cell 10a. Similarly, at the back surface of the second solar cell 10b, the connection member 142 longitudinally extends on (e.g., is in contact with or is attached to) the second finger electrodes 44a and the second insulating layer (e.g., the passivation layer 32) between the second finger electrodes 44a. Accordingly, the connection member 142 may be alternately disposed on the second finger electrode 44a and the second insulating layer at the back surface of the second solar cell 10b. In FIG. 6 and the above description, the front surface of the first solar cell 10a and the back surface of the second solar cell 10b are mainly described. However, the above contents may be applied to the front surface of each solar cell 10 and the back surface of each solar cell 10. Alternatively, electrodes having different shapes from those of the first and second finger electrodes 42a and 44a may be formed. Also, unlike the above, planar shapes of the first electrode 42 and the second electrode 44 may be different from each other or may have no similarity, and various other modifications are possible.

Referring to FIGS. 1 to 4, in the embodiment, the plurality of solar cells 10 each having the major axis and the minor axis may extend in one direction by using the overlapped portion OP and the connection member 142.

More specifically, the overlapped portions OP where two adjacent solar cells (that is, the first and second solar cells 10a and 10b) of the plurality of solar cells 10 are overlapped with each other are provided. That is, a part of one side of the first solar cell 10a in the direction of the minor axis and a part of the other side of the second solar cell 10b in the direction of the minor axis are overlapped with each other to form the overlapped portions Ops. The overlapped portion OP may extend along the direction of the major axis of the first and second solar cells 10a and 10b. The connection member 142 is positioned between the first and second solar cells 10a and 10b in the overlapped portions OP to connect the first and second solar cells 10a and 10b. The connection member 142 may be extended along the direction of the major axis of the first and second solar cells 10a and 10b along the overlapped portions OP. Thereby, the first electrode 42 of the first solar cell 10a positioned at the overlapped portion OP and the second electrode 44 of the second solar cell 10b positioned at the overlapped portion OP are electrically connected. When the solar cells 10 each having the minor axis and the major axis are connected as described above, the connection member 142 longitudinally extends in the direction of the major axis in the solar cell 10. Thus, a connection area of the solar cells 10 can be sufficiently secured and the solar cells 10 can be stably connected.

The connection structure of the adjacent first and second solar cells 10a and 10b as described above is repeated in two solar cells 10 adjacent to each other so that a plurality of solar cells 10 are connected in series in the first direction (the x-axis direction in the drawing) or the direction of the minor axis of the solar cell 10 to constitute a solar cell string 102 formed of a row. Such a solar cell string 102 may be formed by any of various methods or apparatuses.

The connection member 142 may include an adhesive material. As the adhesive material, any of various materials capable of electrically and physically connecting the two solar cells 10 with an electrical conductivity and an adhesive property may be used. For example, the connection member 142 may be formed of an electrical conductive adhesive, a solder, or the like. The connection member 142 will be described later in more detail.

An interconnector member 104 for connecting one solar cell string 102 to another solar cell string or an outside (e.g., an external circuit, for example, a junction box) is connected to an end of the solar cell strings 102 (more specifically, an end portion of the first or second end solar cells 10c or 10d positioned at the end of the solar cell strings 102). The interconnector member 104 may include a first interconnector 105 connected to an end of the solar cell string 102 or an end of the first or second end solar cell 10c or 10d positioned at the end of the solar cell string 102, and a second interconnector 106 having a separate structure from the interconnector 105 and connected to the first interconnector 105. In this instance, when a plurality of solar cells 10 or solar cell strings 102 spaced apart from each other in the second direction (the y-axis direction in the drawing) are provided, the first interconnector 105 is individually positioned to correspond to each solar cell string 102 and protrudes outward in a direction parallel to an extended direction of the solar cell string 102 (that is, the first direction (the x-axis direction in the drawing) or the direction of the minor axis of the solar cell 10), and the second interconnector 106 has a portion extending in a second direction crossing (for example, perpendicular to) the extended direction of the solar cell string 102 (that is, the first direction or the direction of the minor axis of the solar cell 10). In this instance, the second interconnector 106 (for example, one second interconnector 106) may be disposed to connect at least some of the plurality of solar cell strings 102 (that is, to be connected to the plurality of first interconnectors 105 included in the plurality of solar cell strings 102). However, embodiments of the invention are not limited thereto.

One first interconnector 105 may be positioned at one end of each solar cell string 102 and another one first interconnector 105 may be positioned at the other end of each solar cell string 102. In each solar cell string 102, the one first interconnector 105 at the end of each solar cell string 102 is connected to the first electrode 42 at the front surface of the solar cell 10, and the another first interconnector 105 at the other end of each solar cell string 102 is connected to the second electrode 44 at the back surface of the solar cell 10. The two first interconnectors 105 positioned at both ends of the solar cell string 102 may extend along the first direction (the x-axis direction in the drawing) and protrude outwardly to an outside.

More specifically, the first interconnector 105 may include a first portion 1051 and a second portion 1052. The first portion 1052 may be overlapped with an end portion of the first or second end solar cell 10c or 10d and longitudinally extend in the direction of the major axis. The second portion 1052 may protrude from the first portion 1051 toward the outside. The first portion 1051 is a portion for connection with the first or second end solar cell 10c or 10d and the second portion 1052 is a portion connected to the second interconnector 106. In the embodiment, the first portion 1051 longitudinally extends in the direction of the major axis, and the connecting area with the end solar cell 10c or 10d and the first interconnector 105 is sufficiently secured, thereby improving a connection property. The second portion 1052 has a partially protruding shape, and thus, the material cost can be reduced and the second portion 1052 can be easily folded along a bending line BL. The bending line BL will be described later in more detail. In this instance, a plurality of second portions 1052 may be provided in the second direction to maximize the area of connection with the second interconnector 106 while reducing a total area of the second portions 1052.

The second interconnector 106 may include a portion longitudinally extending in the second direction. In FIG. 2, in one solar cell string 102 (i.e., the solar cell string 102 at a left side of FIG. 2), the one first interconnector 105 is positioned at the front surface to be connected to the first electrode 42 at the first end solar cell 10c, and the another first interconnector 105 is positioned at the back surface to be connected to the second electrode 44 at the second end the solar cell 10d. Also, in another solar cell string 102 (i.e., the solar cell string 102 at a right side of FIG. 2), the one first interconnector 105 is positioned at the back surface to be connected to the second electrode 44 at the first end solar cell 10c, and the another first interconnector 105 is positioned at the front surface to be connected to the first electrode 42 at the second end the solar cell 10d. That is, at one ends of the solar cell strings 102, the first interconnectors 105 are alternately positioned at the front surface and the back surface in the first or second solar cells 10c or 10d in the second direction. At one side of the first end solar cells 10c, the second interconnector 106 connects the first interconnectors 105 protruded from the two solar cell strings 102 shown in FIG. 2, and the solar cell strings 102 shown in FIG.

2 are connected. Also, at the other side of the second end solar cells 10*d*, the second interconnector 106 is connected to the first interconnectors 105 protruded from the one solar cell strings 102 (i.e., the solar cell string 102 at the left side of FIG. 2) and extends to the left side. Also, at the other side of the second end solar cells 10*d*, another second interconnector 106 is connected to the first interconnectors 105 protruded from the other solar cell strings 102 (i.e., the solar cell string 102 at the right side of FIG. 2) and extends to the right side. Then, the plurality of solar cell strings 102 are connected to each other in series by the second interconnector 106 alternatively positioned at both ends. However, embodiments of the invention are not limited thereto, and various modifications are possible, for example, the solar cell strings 102 are connected in parallel.

In this instance, in order to minimize an non-active area not directly involved in a photoelectric conversion in the solar cell panel 100 and improve an appearance of the solar cell panel 100, a part of the first interconnector 105 is bent by folding along the bending line BL so that a portion of the first interconnector 105 and the second interconnector 106 may be positioned on the back surface of the solar cell string 102. In this instance, the bending line BL may be positioned in the second portion 1052 so that the first portion 1051 can be stably connected to the solar cell 10. Hereinafter, the description will be made with reference to the solar cell string 102 positioned on the left side of FIG. 2.

The first interconnector 105 connected to the front surface of the first end solar cell 10*c* is folded along the bending line BL so that a part of the second portion 1052 may be positioned on the back surface of the solar cell string 102 by a bent portion extending along the side surface of the first end solar cell 10*c* and then extending to the back surface of the solar cell string 102. Thus, the second interconnector 106 is connected to the second portion 1052 positioned on the back surface of the solar cell string 102. In this instance, a first insulating layer 109*a* may be positioned between the side surface and the back surface of the first end solar cell 10*c* and the first and second interconnectors 105 and 106 to prevent an unnecessary electrical connection.

The first interconnector 105 connected to the back surface of the second end solar cell 10*d* is folded along the bending line BL so that a part of the second portion 1052 and the second interconnector 106 may be overlapped with the back surface of the solar cell string 102 by a bent portion. In this instance, a second insulating layer 109*a* may be positioned between the back surface of the second end solar cell 10*d* and the first and second interconnectors 105 and 106 to prevent an unnecessary electrical connection.

The first or second insulating layer 109*a* or 10*b* may be formed to correspond to each of the first or second end solar cell 10*c* or 10*d*, or may longitudinally extend in the second direction, like the second interconnector 106, to be positioned at the plurality of solar cell strings 102. The first or second insulating layer 109*a* or 109*b* may including any of various known insulating materials (e.g., resin) and may be formed of any of various forms, such as films, sheets, and the like. The first or second insulating layer 109*a* or 109*b* may be positioned between the solar cell 10 and the interconnector member 104 when the interconnector member 104 is folded after being manufactured separately from the interconnector member 104.

In one example, the first interconnector 105 may be thinner than the second interconnector 106. In this instance, a first core layer 105*a* may be thinner than a second core layer 106*a*, and/or a first solder layer 105*b* may be thinner than a second solder layer 106*b*. Then, the first interconnector 105 can be easily folded, and stress applied to the solar cell 10 (i.e., the end solar cell 10*c* or 10*d*) to which the first interconnector 105 is attached can be minimized. However, embodiments of the invention are not limited thereto.

Figure 5:
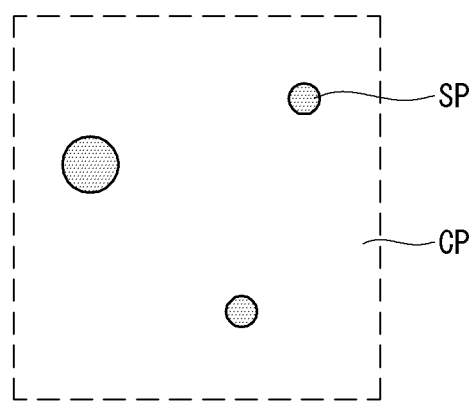
FIG. 5 is a plan view schematically showing a part of an interface between a first interconnector and a second interconnector of the solar cell panel shown in FIG. 1.

In the embodiment, a first connection structure for connecting the first or second end solar cell 10*c* or 10*d* and the first interconnector 105 is different from a second connection structure for connecting the first interconnector 105 and the second interconnector 106, and a first conductive material constituting the first connection structure and a second conductive material constituting the second connection structure differ from each other in at least one of material, composition, and property. This is limited by considering all of materials, properties, and attachment positions of the first interconnector 105 and the second interconnector 106. This will be described in detail with reference to FIG. 5 together with FIGS. 1 to 4. FIG. 5 is a plan view schematically showing a part of an interface between the first interconnector 105 and the second interconnector 106 of the solar cell panel 100 shown in FIG. 1.

In the embodiment, a second connection structure for connecting the first and second interconnectors 105 and 106 may be formed by soldering. Accordingly, the first and second interconnectors 105 and 106 can be connected to each other with a good electrical property by a simple process that can be performed at a low temperature.

More specifically, the first interconnector 105 may include a first core layer 105*a* and a first solder layer 105*b* formed on a surface of the first core layer 105*a*. The second interconnect 106 may include a second core layer 106*a* and a second solder layer 106*b* formed on a surface of the second core layer 106*a*. The first or second core layer 105*a* or 106*a* may include any of various metals, and the first or second solder layer 105*b* or 106*b* may include any of various solder materials. For example, the first or second solder layer 105*b* or 106*b* may include Sn, SnAgCu, SnPb, SnBiCuCo, SnBiAg, SnPbAg, SnAg, SnBi or SnIn.

Accordingly, outer surfaces of the first and second interconnectors 105 and 106 may be entirely covered with the first or second solder layer 105*b* or 106*b*, thereby effectively preventing oxidation, corrosion, and the like of the first or second solder layer 105*a* or 106*a*. Accordingly, the oxidation or the corrosion of the first or second core layer 105*a* or 106*a* does not need to be taken into consideration. A metal being cheap and having high electrical conductivity, even if it has a problem such as oxidation or corrosion, may be used as the first or second core layer 105*a* or 106*a*.

In this instance, each of the first and second core layers 105*a* and 106*a* includes the second conductive material, and the first core layer 105*a* of the second conductive material and the second core layer 106*a* of the second conductive material are melted in the state of being in contact with each other in the soldering process, and then, solidified. Then, the first core layer 105*a* and the second core layer 106*a* may be kept in contact with each other. Accordingly, as shown in FIGS. 1 and 5, at an interface between the first interconnector 105 and the second interconnector 106, a portion where the first and second solder layers 105*b* and 106*b* are not present and a contact portion CP in which the first core layer 105*a* and the second core layer 106*a* directly contact each other is provided. As a result, an attachment property of the first and second interconnectors 105 and 106 can be improved and a contact resistance between the first and second interconnectors 105 and 106 can be reduced. For example, if an area ratio of the contact portion CP to an area of the interface between the first interconnector 105 and the second interconnector 106 is 50% or more (that is, 50% to 100%, for example, 60% to 100%). Within this range, an effect by the contact portion CP can be improved. For example, the solder portion SP formed of the first solder layer 105b, the second solder layer 106b, or a mixed material of the first and second solder layers 105b and 106b may be positioned at the interface between the first interconnect 105 and the second interconnect 106. An area of the solder portion SP may be smaller than an area of the contact portion CP, for an example, the solder portion SP may not be provided.

At the outer surfaces of the first and second interconnectors 105 and 106, except for the interface between the first interconnector 105 and the second interconnector 106, the first or second solder layer 105b or 106b are formed at a higher area ratio than the interface, thereby effectively preventing oxidation or corrosion of the first or second core layer 105a or 106a. At the outer surfaces of the first and second interconnectors 105 and 106, except for the interface between the first interconnector 105 and the second interconnector 106, the first or second solder layers 105b or 106b may be positioned entirely. Although the first and second solder layers 105b and 106b are illustrated as separate layers in the drawing, the first and second solder layers 105b and 106b may be soldered together and is solidified by the soldering process, and thus, may form a common single layer.

In this instance, when the first core layer 105a and the second core layer 106a include the same material as described above, problems such as unexpected changes in physical properties and the generation of impurities that may occur when different materials are used can be prevented. For example, the first and second core layers 105a and 106a may include copper (Cu) as the second conductive material. Then, the first and second interconnectors 105 and 106 can have a high conductivity and a cost for the first and second interconnectors 105 and 106 can be reduced.

The same solder material may be used for the first solder layer 105b and the second solder layer 106b. When the first solder layer 105b and the second solder layer 106b include the same material, problems such as unexpected changes in physical properties and the generation of impurities that may occur when different materials are used can be prevented. However, embodiments of the invention are not limited thereto, and the first solder layer 105b and the second solder layer 106b may include different solder materials.

The first connection structure for connecting the end solar cell 10c or 10d (more specifically, the first electrode 42 of the first end solar cell 10c or the second electrode 44 of the second end solar cell 10d) and the first interconnector 105 may be formed by an electrical conductive adhesive layer 108. That is, the end solar cell 10c or 10d and the first interconnector 105 may be connected to each other by the electrical conductive adhesive layer 108 positioned therebetween. More specifically, the electrical conductive adhesive layer 108 is disposed between the first end solar cell 10c and the first portion 1051 of the first interconnector 105 connected thereto and longitudinally extends in the second direction so as to correspond to the first portion 1051. Similarly, the electrical conductive adhesive layer 108 is disposed between the second end solar cell 10d and the first portion 1051 of the first interconnector 105 connected thereto and longitudinally extends in the second direction so as to correspond to the first portion 1051. Thus, a connection area or a contact area between the solar cell 10 and the first interconnector 105 can be sufficiently secured.

As described above, when the electrical conductive adhesive layer 108 is used, the first interconnector 105 including the first core layer 105a and the first solder layer 105b formed of a metal as a base material can be stably attached to the solar cell including the semiconductor substrate 12 including the semiconductor material, the first and second insulating layers (i.e., the first passivation layer 22, the anti-reflection layer 24, and the second passivation layer 32) with a simple process.

The conductive adhesive layer 108 may include an electrical conductive adhesive (ECA) material. The electrical conductive adhesive material is a paste material or a liquid-state material having a viscosity and including a first conductive material, a binder, a solvent, and the like. The electrical conductive adhesive material is applied by a nozzle or the like, and then, cured at a predetermined temperature so that the electrical connection is established by the first conductive material. In the curing process, most of the solvent may be removed. Such an electrical conductive adhesive material may have any of various thicknesses, shapes, and the like so as to have good adhesion, and can be applied and cured by a simple process. In this instance, since the electrical conductive adhesive layer 108 includes the binder together with the first conductive material, a metal content of the electrical conductive adhesive layer 108 may be lower than that of the second connection structure or the first and second interconnectors 105 and 106.

Also, a temperature of the curing process of the electrical conductive adhesive material may be lower than a temperature of the soldering process for the second connection structure. According to this, damage and a property change of the solar cell 10 can be prevented and the solar cell 10 can be protected in the process of attaching the solar cell 10 and the first interconnector 105. Also, the electrical conductive adhesive material can be easily cured by a curing process for a very short time (e.g., within a few minutes). In addition, since a shear stress of the electrical conductive adhesive material is lower than a shear stress of a material constituting the first or second interconnectors 105 and 106, a shape of the electrical conductive adhesive material can be changed more easily when the stress is applied to the solar cell string 102, and thus, damage to the string 102, a property change, and the like can be minimized In the embodiment, the solar cell 10 and the first interconnector 105 should be connected to each other so as to have a good adhesion property and a good electrical property. In consideration of this, the solar cell 10 and the first interconnector 105 are attached using the electrical conductive adhesive layer 108 having a binder and an excellent adhesion force. Any of various materials known as binders may be used for the binder, for example, resins (for example, epoxy resin) and the like may be used for the binder. In this instance, the first conductive material may include a metal having a lower electrical resistance than the second conductive material so as to have an excellent electrical property. Then, when the semiconductor substrate 12 and the first or second bus bar electrodes 42b and 44b have a high contact resistance, a high contact resistance can be compensated by the electrical conductive adhesive layer 108 having a low electrical resistance, or a bypass path having a low contact resistance can be formed by the electrical conductive adhesive layer 108 through being in direct contact with the second finger electrodes 42a and 44a. Thus, the carrier collection and delivery efficiency can be improved. In one example, the electrical conductive adhesive layer 108 may include silver (Ag) having a lower electrical resistance than the second conductive material as the first conductive material. If the first conductive material included in the electrical conductive adhesive layer 108 is a material which is likely to cause problems such as corrosion and oxidation, stability may be deteriorated. In consideration of this, a metal (for example, silver) superior to the second conductive material in corrosion resistance, oxidation resistance and the like may be used as the first conductive material.

As described above, it is exemplified that the first conductive material and the second conductive material are formed of different materials. However, embodiments of the invention are not limited thereto. Therefore, the first conductive material and the second conductive material may include the same material, but the composition and/or the property may be different.

For example, an adhesion force between the solar cell 10 and the first interconnector 105 by the first connection structure may be greater than that between the first interconnector 105 and the second interconnector 106 by the second connection structure. This is because the electrical conductive adhesive layer 108 constituting the first connection structure includes a binder and thus can have excellent adhesion. According to this, the solar cell 10 and the first interconnector 105 based on different materials can be stably attached.

An electrical resistance between the solar cell 10 and the first interconnector 105 by the first connection structure may be the same as or lower than an electrical resistance between the first interconnector 105 and the second interconnector 106 by the second connection structure. According to this, carriers generated and collected at the solar cell 10 can be stably transmitted to the first interconnector 105. This electrical resistance relationship may be realized by including the first conductive material having a lower electrical resistance than the second conductive material in the electrical conductive adhesive layer 108 constituting the first connection structure. However, embodiments of the invention are not limited thereto, and the electrical resistance between the solar cell 10 and the first interconnector 105 by the first connection structure may be greater than the electrical resistance between the first interconnector 105 and the second interconnector 106.

Meanwhile, the plurality of solar cells 10 may be connected to each other by a different structure from at least one of the first connection structure and the second connection structure. Here, "by a different structure" may mean completely different connection structures, or mean different conductive materials, composition, properties, etc. forming the connection structures.

As described above, the plurality of solar cells 10 may be connected by the connection member 142, and the connection member 142 may include a solder, or an electrical conductive adhesive material. In particular, the connection member 142 may include an electrical conductive adhesive material and may be different from the second connection structure formed of soldering. Thus, adhesion and electrical properties can be improved. The connection member 142 may include the same conductive material as the first conductive material. As such, when the connection member 142 includes the same conductive material as the first conductive material, it may have a low electrical resistance or the like.

In this instance, the connection member 142 and the electrical conductive adhesive layer 108 may include the same material or may include different materials. That is, the conductive material of the connection member 142 is the same as the first conductive material of the electrical conductive adhesive layer 108, but other materials (such as a binder) of the connection member 142 may be the same as or different from those of the electrical conductive adhesive layer 108. Particularly, when the connection member 142 is formed of the same material as the electrical conductive adhesive layer 108, the connection member 142 and the electrical conductive adhesive layer 108 can be formed by a simple process using the same material. When the connection member 142 is formed of the same material as the electrical conductive adhesive layer 108, the kind, material, and content of the first conductive material and the kind, material, and content of the binder included in the electrical conductive adhesive layer 108 may be the same as he kind, material, and content of the conductive material and the kind, material, and content of the binder included in the connection member 142.

In the case where the connection member 142 includes the same conductive material (particularly, the same material) as the electrical conductive adhesive layer 108, the description of the electrical conductive adhesive layer 108 described above may be applied to the connection member 142 as it is. The description of the electrical conductive adhesive layer 108, the description of the first connection structure, the description to the relationship between the first conductive material and the soldering, between the first conductive material and the second connection structure, between the first conductive material and the second conducive material may be applied to the description of the connection member 142, the description of the connection structure of the plurality of solar cells 10, the description to the relationship between the conductive material included in the connection member 142 and the soldering, between the conductive material included in the connection member 142 and the second connection structure, between the conductive material included in the connection member 142 and the second conducive material, respectively, as it is.

For example, an electrical resistance of the conductive material of the connection member 142 may be lower than an electrical resistance of the second conductive material. The conductive material of the connection member 142 may include silver (Ag). The connection structure of the plurality of solar cells 10 or an adhesion force by the connection member 142 may be greater than an adhesion force by the second connecting structure. An electrical resistance of the connection structure of the plurality of solar cells 10 or an electrical resistance of the connection member 142 may be equal to or less than an electrical resistance of the second connection structure. However, embodiments of the invention are not limited thereto, and the electrical resistance by the connection structure of the plurality of solar cells 10 or an electrical resistance by the connection member 142 may be greater than an electrical resistance by the second connection structure. In this instance, when the connection member 142 includes the electrical conductive adhesive material, since the connection member 142 includes the binder together with the conductive material (e.g., the first conductive material), a metal content of the connection member 142 may be lower than that of the second connecting structure or the first and second interconnectors 105 and 106.

According to the embodiment, the interconnector member 104 includes the first and second interconnectors 105 and 106, and the first connection structure for connecting the solar cell 10 and the first interconnector 105 is different from the second connection structure for connecting the first interconnector 105 and the second interconnector 106. Thus, the adhesion force, the electrical connection property, and the like between the solar cell 10 and the interconnector member 104 can be improved, and a cost of the interconnector member 104 can be reduced. Thus, stability, efficiency, and productivity of the solar cell panel 100 can be improved.

In FIG. 2, it is exemplified that a part of the second interconnector 106 in the first direction corresponds to the second portion 1052, and another part of the second interconnector 106 in the first direction corresponds to an outside of the second portion 1052. The second interconnector 106 has a sufficient width in the first direction and is stably connected to the second portion 1052. However, embodiments of the invention are not limited thereto.

Figure 7:
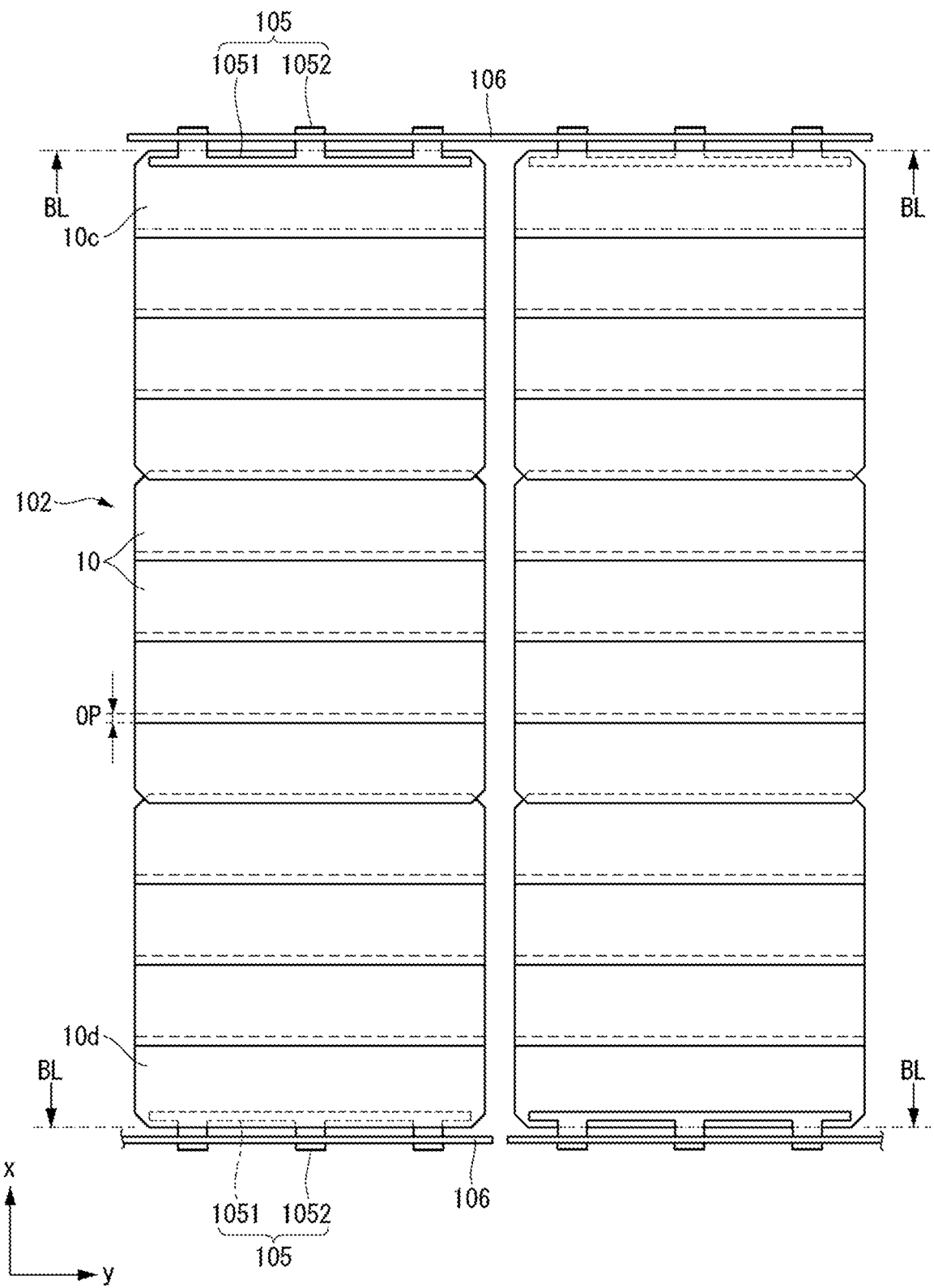
FIG. 7 is a developed view schematically showing some of a plurality of solar cell strings and interconnector members connected thereto, which are included in a solar cell panel according to another modified embodiment.

As an modified example, as shown in FIG. 7, a width of a second interconnector 106 in a first direction (an x-axis direction in the drawing) may be smaller than a protruding length of a second portion 1052 in the first direction, and thus, an entire portion of the second interconnector 106 in the first direction may be positioned in the second portion 1052. That is, the second interconnect 106 may be disposed to penetrate through an interior of the second portion 1052. Then, an area of the second interconnector 106 can be reduced to reduce the material cost, and a stress applied to a first interconnector 105 by the second interconnector 106 can be minimized. Accordingly, a manufacturing cost of the solar cell panel 100 can be reduced and reliability can be improved. Various other modifications are possible.

Figure 8:
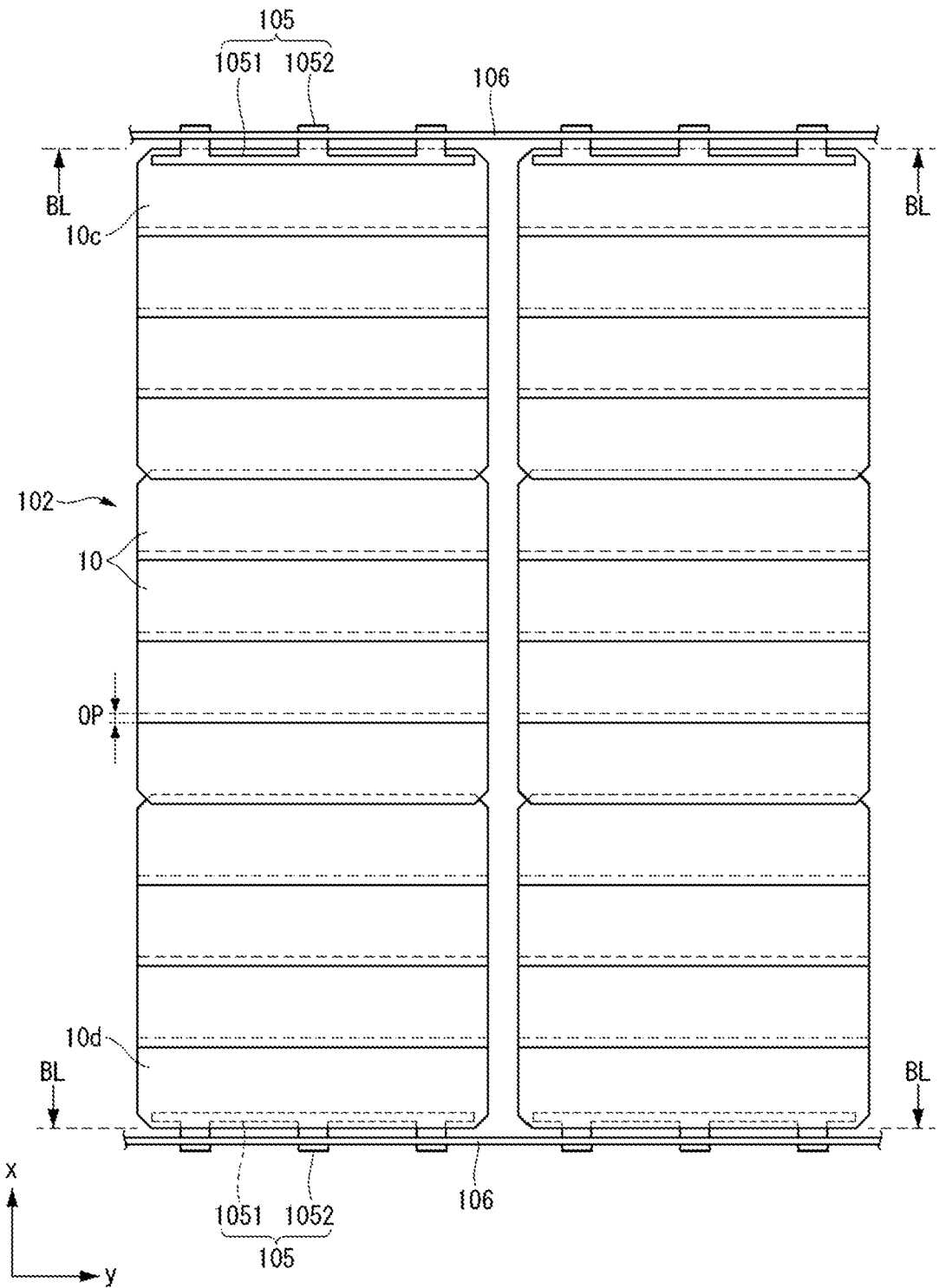
FIG. 8 is a developed view schematically showing some of a plurality of solar cell strings and interconnector members connected thereto, which are included in a solar cell panel according to still another modified embodiment.

In the above description and drawings, it is exemplified that a plurality of solar cell strings 102 positioned in a second direction (a y-axis direction in the drawing) are connected in series. However, embodiments of the invention are not limited thereto. Alternatively, as shown in FIG. 8, a plurality of solar cell strings 102 positioned in the second direction may be connected in parallel. For example, in each solar cell string 102, a first interconnection 105 is positioned on a front surface of a first end solar cell 10c so as to be connected to a first electrode 42, and another first interconnector 105 is positioned on the back surface of a second end solar cell 10d so as to be connected to a second electrode 44. At one side of the solar cell strings 102, a second interconnector 106 connects a plurality of first interconnectors 105 connected to the first electrodes 42 of the first end solar cells 10c and protruded to the one side. At the other side of the solar cell strings 102, another second interconnector 106 connects a plurality of first interconnectors 105 connected to the second electrodes 44 of the second end solar cells 10d and protruded to the other side. Thus, the plurality of solar cell strings 102 can be connected to each other in parallel by the second interconnectors 106. Any of various other structures can be applied.

In FIG. 8, it is exemplified that a width of the second interconnector 106 is smaller than a protruding length of the second portion 1052 and an entire portion of the second interconnector 106 is positioned in the second portion in the first direction as shown in FIG. 7. However, embodiments of the invention are not limited thereto, and the second interconnector 106 may have a shape and an arrangement as shown in FIG. 2.

The above-described features, structures, effects, and the like are included in at least one embodiment of the invention, and are not necessarily limited to only one embodiment. Further, the features, structures, effects and the like illustrated in the embodiments may be combined and modified by persons skilled in the art to which the embodiments are pertained. Therefore, it is to be understood that embodiments of the invention are not limited to these embodiments, and various combined and modified embodiments are included in a scope of the invention.

What is claimed is:

1. A solar cell panel comprising:
   a solar cell string comprising a plurality of solar cells that are connected to each other and that are arranged in a first direction;
   a connection member that is configured to connect two adjacent solar cells of the plurality of solar cells to each other in the first direction and that is located at an overlapped portion between the two adjacent solar cells, the connection member comprising a first conductive material;
   a first interconnector connected to an end solar cell of the plurality of solar cells, the end solar cell being positioned at an end of the solar cell string, the first interconnector comprising:
      a first portion that overlaps a surface of the end solar cell and that extends along the surface of the end solar cell in a second direction transverse to the first direction, and
      a second portion that protrudes outward from the first portion in the first direction;
   a second interconnector that is connected to the second portion of the first interconnector, that extends in the second direction, and that is spaced apart from the end solar cell;
   a first connection structure configured to connect the end solar cell to the first interconnector, the first connection structure comprising the first conductive material; and
   a second connection structure that is configured to connect the first interconnector to the second interconnector, the second connection structure comprising a second conductive material that is different from the first conductive material.

2. The solar cell panel of claim 1, wherein the first connection structure further comprises a conductive adhesive layer that is located between the end solar cell and the first interconnector and that connects the end solar cell to the first interconnector, and
   wherein the second connection structure comprises a solder material that connects the first interconnector to the second interconnector.

3. The solar cell panel of claim 2, wherein the first interconnector comprises a first core layer and a first solder layer located on a surface of the first core layer, and
   wherein the second interconnector comprises a second core layer and a second solder layer located on a surface of the second core layer.

4. The solar cell panel of claim 3, wherein each of the first core layer and the second core layer comprises the second conductive material.

5. The solar cell panel of claim 3, wherein the first solder layer comprises a first solder material, and the second solder layer comprises the first solder material.

6. The solar cell panel of claim 3, wherein the first core layer and the second core layer are configured to contact each other at a contact portion located at an interface between the first interconnector and the second interconnector, and
   wherein the first solder layer and the second solder layer are absent from the contact portion.

7. The solar cell panel of claim 6, wherein a ratio of an area of the contact portion to an area of the interface between the first interconnector and the second interconnector is greater than or equal to 50%.

8. The solar cell panel of claim 6, wherein the first solder layer and the second solder layer surround outer surfaces of the first interconnector and the second interconnector, the outer surfaces being located outside of the interface between the first interconnector and the second interconnector.

9. The solar cell panel of claim 1, wherein an electric resistance of the first conductive material is less than an electric resistance of the second conductive material.

10. The solar cell panel of claim 1, wherein the first conductive material comprises silver (Ag), and
wherein the second conductive material comprises copper (Cu).

11. The solar cell panel of claim 1, wherein a thickness of the first interconnector in a direction transverse to an interface between the first interconnector and the second interconnector is less than a thickness of the second interconnector in the direction transverse to the interface.

12. The solar cell panel of claim 1, wherein the first connection structure is configured to apply first adhesion force to the end solar cell and the first interconnector, and
wherein the second connection structure is configured to apply second adhesion force to the first interconnector and the second interconnector, the second adhesion force being less than the first adhesion force.

13. The solar cell panel of claim 1, wherein an electric resistance of the first connection structure is less than or equal to an electric resistance of the second connection structure.

14. The solar cell panel of claim 1, wherein the first interconnector further comprises:
a bent portion that is bent from the second portion toward the first portion and that extends below the end solar cell,
wherein the second portion of the first interconnector comprises a plurality of connecting parts spaced apart from one another in the second direction and connected to the second interconnector, and
wherein a part of each of the first interconnector and the second interconnector is positioned at a back surface of the solar cell string.

15. The solar cell panel of claim 1, wherein the solar cell string comprises a plurality of solar cell strings that are spaced apart from each other in the second direction transverse to the first direction,
wherein the first interconnector comprises a plurality of first interconnectors that are each located at one of the plurality of solar cell strings, each first interconnector protruding to an outside of one of the plurality of solar cell strings, and
wherein the second interconnector extends in the second direction.

16. The solar cell panel of claim 15, wherein the second interconnector is configured to connect to the plurality of first interconnectors.

17. The solar cell panel of claim 1, wherein each solar cell comprises:
a semiconductor substrate; and
a plurality of finger electrodes that are arranged at the semiconductor substrate, that are parallel to each other, and that extend in the first direction.

18. The solar cell panel of claim 1, further comprising:
an insulating layer that is disposed at the end solar cell, that is covered by the first portion of the first interconnector, and that is spaced apart from the second portion of the first interconnector.

19. The solar cell panel of claim 18, further comprising a conductive adhesive layer that contacts the end solar cell and the first portion of the first interconnector,
wherein at least a part of the first portion of the first interconnector is disposed between the conductive adhesive layer and the insulating layer.

20. The solar cell panel of claim 18, further comprising a conductive adhesive layer that contacts the end solar cell and the first portion of the first interconnector,
wherein the insulating layer contacts the end solar cell, and the first portion of the first interconnector covers outer surfaces of the insulating layer and the conductive adhesive layer.

* * * * *